(12) United States Patent
Carlson et al.

(10) Patent No.: US 8,209,993 B2
(45) Date of Patent: Jul. 3, 2012

(54) WARM WATER COOLING

(75) Inventors: Andrew Carlson, Atherton, CA (US);
William Whitted, Woodside, CA (US);
Jimmy Clidaras, Los Altos, CA (US);
William Hamburgen, Palo Alto, CA
(US); Gerald Aigner, Pfaeffikon (CH);
Donald L. Beaty, Red Bank, NJ (US)

(73) Assignee: Exaflop LLC, Mountain View, CA (US)

( * ) Notice: Subject to any disclaimer, the term of this patent is extended or adjusted under 35 U.S.C. 154(b) by 132 days.

(21) Appl. No.: 11/757,345

(22) Filed: Jun. 1, 2007

(65) Prior Publication Data

US 2008/0029250 A1 Feb. 7, 2008

Related U.S. Application Data

(60) Provisional application No. 60/810,668, filed on Jun. 1, 2006.

(51) Int. Cl.
*F25D 23/12* (2006.01)
(52) U.S. Cl. ............... 62/259.2; 62/150; 62/185; 62/201
(58) Field of Classification Search ............... 62/259.2, 62/150, 185, 201
See application file for complete search history.

(56) References Cited

U.S. PATENT DOCUMENTS

| | | | | |
|---|---|---|---|---|
| 4,313,310 A * | 2/1982 | Kobayashi et al. | ............ | 62/175 |
| 4,474,027 A * | 10/1984 | Kaya et al. | ...................... | 62/171 |
| 4,526,011 A * | 7/1985 | Logan et al. | ................. | 62/176.1 |
| 6,412,292 B2 * | 7/2002 | Spinazzola et al. | ............... | 62/89 |
| 7,219,714 B1 * | 5/2007 | Heydari | ....................... | 165/80.4 |
| 2003/0173688 A1* | 9/2003 | Koo | ............................. | 261/109 |
| 2004/0089011 A1* | 5/2004 | Patel et al. | .................... | 62/259.2 |
| 2004/0206101 A1* | 10/2004 | Bash et al. | ....................... | 62/180 |
| 2005/0103032 A1* | 5/2005 | Pierson | ........................... | 62/175 |

FOREIGN PATENT DOCUMENTS

CN 1546911 A 11/2004

OTHER PUBLICATIONS

Notification of the First Office Action from The State Intellectual Property Office of the People's Republic of China (10 pages), mailed Jun. 11, 2010, for related Chinese application 200680055420.3.

* cited by examiner

*Primary Examiner* — Cheryl J Tyler
*Assistant Examiner* — Jonathan Koagel
(74) *Attorney, Agent, or Firm* — Fish & Richardson P.C.

(57) ABSTRACT

A method of providing cooled air to electronic equipment includes capturing heated air from a volume containing electronic equipment, cooling the heated air by more than fifteen degrees Celsius in an air-to-water heat exchanger, and supplying cooling water to the air-to-water heat exchanger at a temperature above a dew point temperature of the heated air.

27 Claims, 7 Drawing Sheets

WARM WATER COOLING

CROSS-REFERENCE TO RELATED APPLICATIONS

This application claims priority to U.S. Application Ser. No. 60/810,668, filed on Jun. 1, 2006, the contents of which is hereby incorporated by reference.

TECHNICAL FIELD

This document relates to systems and methods for providing cooling for areas containing electronic equipment, such as computer server rooms and server racks in computer data centers.

BACKGROUND

Computer users often focus on the speed of computer microprocessors (e.g., megahertz and gigahertz). Many forget that this speed often comes with a cost-higher electrical power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, for the most part, conversion into heat. A pair of microprocessors mounted on a single motherboard can draw 200-400 watts or more of power. Multiply that figure by several thousand (or tens of thousands) to account for the many computers in a large data center, and one can readily appreciate the amount of heat that can be generated. It is much like having a room filled with thousands of burning floodlights.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause great increases in microprocessor errors and failures. In sum, such a system may require electricity to run the chips, and more electricity to cool the chips.

SUMMARY

This document describes systems and methods that may be employed to remove heat efficiently from areas hosting electronic equipment, such as data centers. In certain implementations, cooling of equipment may occur at elevated air temperatures. For example, high temperature rises may be created across a group of heat-generating components by intentionally slowing the flow of cooling air over the components. For example, temperature rises across the components of thirty-six degrees Fahrenheit (twenty degree Celsius) or more may be maintained, with entering air temperatures of about seventy-seven degrees Fahrenheit (twenty-five degrees Celsius) and exiting temperatures of about one hundred thirteen degrees Fahrenheit (forty-five degrees Celsius). The temperatures of any associated cooling water may also be elevated, such as to produce supply temperatures of about sixty-eight degrees Fahrenheit (twenty degrees Celsius) and return temperatures of about one hundred four degrees Fahrenheit (forty degrees Celsius). Because of the elevated temperatures, the system may be run under most conditions using only cooling from cooling towers or other free cooling sources, without the need for a chiller or other similar sources that require additional power for cooling.

In one implementation, a method of providing cooled air to electronic equipment is disclosed. The method comprises capturing heated air from a volume containing electronic equipment, cooling the heated air by more than fifteen degrees Celsius in an air-to-water heat exchanger, and supplying cooling water to the air-to-water heat exchanger at a temperature above a dew point temperature of the heated air. The step of capturing the heated air may comprise capturing substantially only the heated air, and capturing substantially no air that is not from the volume containing the electronic equipment. The cooling water may be returned from the air-to-water heat exchanger at a temperature above 40 degrees Celsius.

In some aspects, the method further comprises returning water from the air-to-water heat exchanger, wherein the temperature of the supplied water is more than 15 degrees Celsius cooler than the temperature of the returned water. The method may also comprise returning water from the air-to-water-heat exchanger and transferring heat from the returned water to water supplied from an evaporative cooling water source. The evaporative cooling water source may comprise one or more cooling towers, and the temperature of the returned water may be more than 10 degrees Celsius warmer than the water supplied from the evaporative cooling water source. In addition, the approach temperature of the cooled air and the cooling water may be less than about 5 degrees Celsius. The method also comprise maintaining a cooling setpoint that is based on an expected wet bulb temperature for substantially continuously for one week or more. Moreover, the cooling setpoint can change substantially continuously.

In another implementation, a method of providing cooled air to electronic equipment is disclosed. The method comprises heating air from a workspace by a temperature differential of more than 20 degrees Celsius by passing it over electronic equipment, cooling the heated air by approximately the same temperature as the temperature differential, and returning the air to the workspace. The method may further comprise cooling the air using evaporative cooling with no refrigeration. Heating the air from the workspace can also comprise heating the air from about 25 degrees Celsius to more than 45 degrees Celsius.

In some aspects, the controlled temperature is at or near a maximum failure preventative temperature for the electronic equipment. Also, the air may be returned directly to the workspace after it is cooled, the electronic equipment can comprise a large plurality of rack servers in a data center.

In another implementation, a system for providing cooled air to electronic equipment is disclosed. The system may comprise an evaporative cooling water source, a water-to-water heat exchanger in fluid communication with the evaporative water source, an air-to-water heat exchanger in fluid communication with the water-to-water heat exchanger and positioned to received heated air from a group of electronic devices, and a control system programmed to cause a supply of cooling water to the water-to-air heat exchanger at a temperature above a dew point of air surrounding the water-to-air heat exchanger. The cooling water source may comprise a cooling tower, and the water-to-water heat exchanger is configured to supply cooling water at 15-35 degrees Celsius.

In another implementation, a system for providing cooled air to electronic equipment is disclosed. The system comprise a cooling tower, a water-to-water heat exchanger connected by a first pair of pipes to the cooling tower, and an air-to-water heat exchanger connected by a second pair of pipes to the water-to-water heat exchanger and positioned to received heated air from a group of electronic devices, wherein the first pair of pipes and the second pair of pipes are substantially lacking in insulation or condensation collecting apparatuses.

In yet another implementation, a method of operating a cooling system is disclosed. The method includes selecting a cooling set point for the cooling system that corresponds to an expected outdoor wet bulb temperature, operating the cooling system to the cooling setpoint if a lower temperature can be maintained, and allowing the cooling system to exceed the cooling setpoint if the cooling setpoint cannot be maintained. In certain aspects, the method further comprises making significant changes to the cooling setpoint only on an infrequent basis to lessen thermal cycling by the system. The infrequent basis can be longer than monthly, and the cooling setpoint can comprise a setpoint for cooling supply water in the system. Also, the cooling setpoint can comprise a setpoint for cooled air or occupied room temperature in the system.

In certain aspects, the system cools a data center containing thousands of computers and the data center does not have access to a chiller. Also, the cooling setpoint may be selected to maintain a temperature below an expected failure level for electronic components cooled by the system. Also, the setpoint may be selected to maintain a temperature in an occupied space that is cooled by the cooling system above 75° F. (23.89° C.). Moreover, the method can further comprise capturing heated air from electronic components in one or more common warm air plenums and cooling the heated air with the cooling system before circulating the cooled air into an occupied workspace.

In another implementation, a data center cooling system is disclosed, and comprises a plurality of evaporative cooling units sized to provide sufficient cooling for the data center on an worst-case expected design day, a plurality of heat exchangers for transferring heat from electronic equipment in the data center to the cooling towers, and no chiller sized to provide more than an insubstantial portion of the cooling provided by the system. The plurality of evaporative cooling units can comprise a plurality of hybrid cooling towers, and the plurality of heat exchangers can comprise coils located adjacent to one or more common hot air plenums that each receive heated air from a plurality of computers. In addition, the system can further comprise a plurality of fans to circulate air through the coils and to provide cooled air directly into an occupied workspace.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
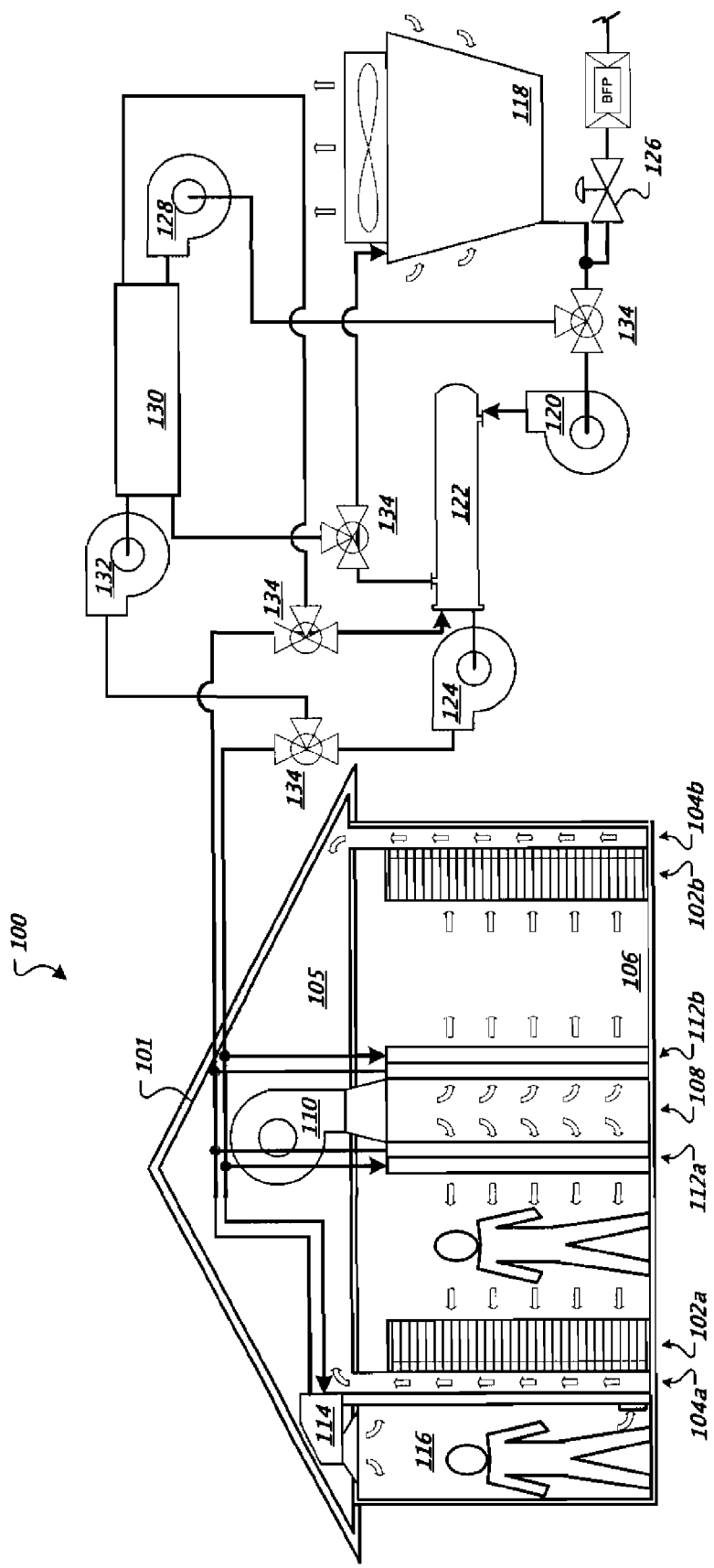
FIG. 1 is a schematic diagram showing a system for cooling a computer data center.

FIG. 1 is a schematic diagram showing a system 100 for cooling a computer data center 101. The system 100 generally includes an air handling unit (including e.g., fan 110 and cooling coils 112a, 112b) in the data center 101 for transferring heat from the data center's air to cooling water, a heat exchanger 122 for removing heat from the cooling water and passing it to cooling tower water, and a cooling tower 118 to pass the accumulated heat to the ambient air through evaporation and cooling of the cooling tower water. In general operation, the system 100 may be run from the cooling tower/heat exchanger/cooling coil system, though a powered refrigeration system such as a chiller may be provided for peak loads, such as when the outdoor ambient dew point is very high and the cooling tower cannot provide sufficient cooling alone. As explained below, control parameters for the system may also be set so as to avoid most or any need for the use of chillers or other such items.

The temperatures of each portion of the system 100 are selected to be relatively high, so as to permit more efficient operation of the system 100, than if the temperatures were lower. For example, relatively high air temperatures in the system (e.g., air entering a cooling coil over 110° F. (43.3° C.) and exiting temperature above 70° F. (21:1° C.)) may in turn permit for relatively high cooling water temperatures (e.g., water entering a cooling coil around 68° F. (20° C.) and exiting around 104° F. (40° C.)) because the amount of heat that can be taken out of the air is generally proportional to the difference in temperature between the water and the air. If the difference can be kept at an acceptable level, where the temperatures are high enough that evaporative cooling (e.g., cooling through a cooling tower, without further cooling via chiller) is sufficient, the relatively high electrical cost of operating a chiller (or many chillers) may be avoided.

High system temperatures may be particularly advantageous in certain implementations when hybrid cooling towers are used. Such hybrid cooling towers combine the functionality of an ordinary cooling tower with a water-to-water heat exchanger. Sufficiently high chosen temperature setpoints may allow the hybrid tower to provide substantial cooling capacity, even when operating in a water-to-air mode without utility water. As a result, a hybrid cooling tower may be used to provide cooling capacity to a facility relatively quickly, even before utility water may be obtained in large volumes. The capacity of the cooling tower may be directly related to the difference in the temperature of the water within it to the ambient outside air.

When the difference in temperatures is not very large, a change of only a few degrees can bring substantial gains in efficiency. For example, where the cooling water enters at 68° F. (20° C.), by heating the water to 113° F. (45° C.) rather than 104° F. (40° C.), the temperature difference of the cooling water is increased from 36° F. to 45° F. (20° C. to 25° C)—which may result in an increase in heat flow of 25 percent. The actual difference will vary slightly, as the entering conditions for air and water are not the only conditions (because the air cools as it passes through a cooling coil, and the water warms); this example, however, indicates how the difference in temperature can affect efficiency of a system.

Use of elevated temperatures in a system may also prevent air in or around the system from falling below its liquid saturation point, i.e., its dew point, and condensing. This may, in certain circumstances, provide benefits both in efficiency and in operations of the system. Efficiency benefits may be obtained because creating condensation requires much more energy than simply cooling air, so that systems creating condensation may use a large amount of electricity or other energy. Improvements in operations of the system may occur because, if pipes in the system carry water that is below the saturation temperature of the air around the pipes, condensation might form on the pipes. That condensation can damage the pipes or equipment in the conditioned space, cause mold, and cause water to pool on the floor, and can require the installation of insulation on the pipes (to stop the condensation).

In the system shown in FIG. 1, use of elevated temperatures may substantially reduce, or almost entirely eliminate, the need for energy-intensive cooling components such as chillers and the like, even where the heat load in the data center 101 is very high. As a result, system 100 may be operated at a lower operating cost than could otherwise be achieved. In addition, lower capital costs may be required, because fans, coils, heat exchangers, and cooling towers are relatively basic and inexpensive components. In addition, by operating with a higher temperature difference between cooled air and cooling water, less volume of cooling water is needed, thus reducing the size and cost of piping, and the cost to operate pumps and other such components.

In addition, those components are often very standardized, so that their acquisition costs are lower, and they are more easily located, particularly in developing countries and remote areas where it may be beneficial to place a data center 101. Use of system 100 in remote areas and other areas with limited access to electrical power is also helped by the fact that system 100 may be operated using less electrical power. As a result, such a system can be located near lower-power electrical sub-stations and the like. As discussed more completely below, lower-powered systems may also be amenable to being implemented as self-powered systems using energy sources such as solar, wind, natural-gas powered turbines, fuel cells, and the like.

Referring now to FIG. 1, there is shown a data center 101 in sectional view, which as shown, is a building that houses a large number of computers or similar heat-generating electronic components. A workspace 106 is defined around the computers, which are arranged in a number of parallel rows and mounted in vertical racks, such as racks 102a, 102b. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 106 across the trays and into warm-air plenums 104a, 104b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 106 is known, controlling the exhaust temperature also indirectly controls the temperature rise. The work space 106 may, in certain circumstances, be referenced as a "cold aisle," and the plenums 104a, 104b as "warm aisles."

The temperature rise can be large. For example, the work space 106 temperature may be about 77° F. (25° C.) and the exhaust temperature into the warm-air plenums 104a, 104b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 105, or into a raised floor or basement, or other appropriate space, and may be gathered there by air handling units that include, for example, fan 110, which may include, for example, one or more centrifugal fans appropriately sized for the task. The fan 110 may then deliver the air back into a plenum 108 located adjacent to the workspace 106. The plenum 108 may be simply a bay-sized area in the middle of a row of racks, that has been left empty of racks, and that has been isolated from any warm-air plenums on either side of it, and from cold-air work space 106 on its other sides. Alternatively, air may be cooled by coils defining a border of warm-air plenums 104a, 104b and expelled directly into workspace 106, such as at the tops of warm-air plenums 104a, 104b.

Cooling coils 112a, 112b may be located on opposed sides of the plenum approximately flush with the fronts of the racks. (The racks in the same row as the plenum 108, coming in and out of the page in the figure, are not shown.) The coils may have a large surface area and be very thin so as to present a low pressure drop to the system 100. In this way, slower, smaller, and quieter fans may be used to drive air through the system. Protective structures such as louvers or wire mesh may be placed in front of the coils 112a, 112b to prevent them from being damaged.

In operation, fan 110 pushes air down into plenum 108, causing increased pressure in plenum 108 to push air out through cooling coils 112a, 112b. As the air passes through the coils 112a, 112b, its heat is transferred into the water in the coils 112a, 112b, and the air is cooled.

The speed of the fan 110 and/or the flow rate or temperature of cooling water flowing in the cooling coils 112a, 112b may be controlled in response to measured values. For example, the pumps driving the cooling liquid may be variable speed pumps that are controlled to maintain a particular temperature in work space 106. Such control mechanisms may be used to maintain a constant temperature in workspace 106 or plenums 104a, 104b and attic 105.

The workspace 106 air may then be drawn into racks 102a, 102b such as by fans mounted on the many trays that are mounted in racks 102a, 102b. This air may be heated as it passes over the trays and through power supplies running the computers on the trays, and may then enter the warm-air plenums 104a, 104b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 110 captures and circulates the warm air.

Additional items may also be cooled using system 100. For example, room 116 is provided with a self-contained fan-coil unit 114 which contains a fan and a cooling coil. The unit 114 may operate, for example, in response to a thermostat provided in room 116. Room 116 may be, for example, an office or other workspace ancillary to the main portions of the data center 101.

In addition, supplemental cooling may also be provided to room 116 if necessary. For example, a standard roof-top or similar air-conditioning unit (not shown) may be installed to provide particular cooling needs on a spot basis. As one example, system 100 may be designed to deliver 78° F. (25.56° C.) supply air to work space 106, and workers may prefer to have an office in room 116 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 100.

Fresh air may be provided to the workspace 106 by various mechanisms. For example, a supplemental air-conditioning unit (not shown), such as a standard roof-top unit may be provided to supply necessary exchanges of outside air. Also, such a unit may serve to dehumidify the workspace 106 for the limited latent loads in the system 100, such as human perspiration. Alternatively, louvers may be provided from the outside environment to the system 100, such as powered louvers to connect to the warm air plenum 104b. System 100 may be controlled to draw air through the plenums when environmental (outside) ambient humidity and temperature are sufficiently low to permit cooling with outside air. Such louvers may also be ducted to fan 110, and warm air in plenums 104a, 104b may simply be exhausted to atmosphere, so that the outside air does not mix with, and get diluted by, the warm air from the computers. Appropriate filtration may also be provided in the system, particularly where outside air is used.

Also, the workspace 106 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 124. The cooling water circuit may be formed as a direct-return, or indirect-return, circuit, and may generally be a closed-loop system. Pump 124 may take any appropriate form, such as a standard centrifugal pump. Heat exchanger 122 may remove heat from the cooling water in the circuit. Heat exchanger 122 may take any appropriate form, such as a plate-and-frame heat exchanger or a shell-and-tube heat exchanger.

Heat may be passed from the cooling water circuit to a condenser water circuit that includes heat exchanger 122, pump 120, and cooling tower 118. Pump 120 may also take any appropriate form, such as a centrifugal pump. Cooling tower 118 may be, for example, one or more forced draft towers or induced draft towers. The cooling tower 118 may be considered a free cooling source, because it requires power only for movement of the water in the system and in some implementations the powering of a fan to cause evaporation; it does not require operation of a compressor in a chiller or similar structure.

The cooling tower 118 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 122, and routing cooling tower water (condenser water) directly to cooling coils 112a, 112b (not shown). Such an implementation may be more efficient, as it removes one heat exchanging step. However, such an implementation also causes water from the cooling tower 118 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 126 is provided in the condenser water circuit to supply make-up water to the circuit. Make-up water may generally be needed because cooling tower 118 operates by evaporating large amounts of water from the circuit. The control valve 126 may be tied to a water level sensor in cooling tower 118, or to a basin shared by multiple cooling towers. When the water falls below a predetermined level, control valve 126 may be caused to open and supply additional makeup water to the circuit. A back-flow preventer (BFP) may also be provided in the make-up water line to prevent flow of water back from cooling tower 118 to a main water system, which may cause contamination of such a water system.

Optionally, a separate chiller circuit may be provided. Operation of system 100 may switch partially or entirely to this circuit during times of extreme atmospheric ambient (i.e., hot and humid) conditions or times of high heat load in the data center 101. Controlled mixing valves 134 are provided for electronically switching to the chiller circuit, or for blending cooling from the chiller circuit with cooling from the condenser circuit. Pump 128 may supply tower water to chiller 130, and pump 132 may supply chilled water, or cooling water, from chiller 130 to the remainder of system 100. Chiller 130 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 122, with common return water from a cooling coil to both structures. The chilled water may be supplied from chiller 130 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 100.

Pumps 120, 124, 128, 132, may be provided with variable speed drives. Such drives may be electronically controlled by a central control system to change the amount of water pumped by each pump in response to changing set points or changing conditions in the system 100. For example, pump 124 may be controlled to maintain a particular temperature in workspace 106, such as in response to signals from a thermostat or other sensor in workspace 106.

In operation, system 100 may respond to signals from various sensors placed in the system 100. The sensors may include, for example, thermostats, humidistats, flowmeters, and other similar sensors. In one implementation, one or more thermostats may be provided in warm air plenums 104a, 104b, and one or more thermostats may be placed in workspace 106. In addition, air pressure sensors may be located in workspace 106, and in warm air plenums 104a, 104b. The thermostats may be used to control the speed of associated pumps, so that if temperature begins to rise, the pumps turn faster to provide additional cooling waters. Thermostats may also be used to control the speed of various items such as fan 110 to maintain a set pressure differential between two spaces, such as attic 105 and workspace 106, and to thereby maintain a consistent airflow rate. Where mechanisms for increasing cooling, such as speeding the operation of pumps, are no longer capable of keeping up with increasing loads, a control system may activate chiller 130 and associated pumps 128, 132, and may modulate control valves 134 accordingly to provide additional cooling.

Various values for temperature of the fluids in system 100 may be used in the operation of system 100. In one exemplary implementation, the temperature setpoint in warm air plenums 104a, 104b may be selected to be at or near a maximum exit temperature for trays in racks 102a, 102b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 100.

Using these parameters and the parameters discussed above for entering and exiting air, relatively narrow approach temperatures may be achieved with the system 100. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

Keeping the approach temperature small permits a system to be run on free, or evaporative, cooling for a larger portion of the year and reduces the size of a needed chiller, if any is needed at all. To lower the approach temperature, the cooling coils may be designed for counterflow rather than for self-draining. In counter-flow, the warmest air flows near the warmest water and the coolest air exits near where the coolest water enters.

In certain implementations, the entering water temperature may be 64° F. (18° C.) and the exiting air temperature 76.6° F. (24.8° C.), as noted above, for an approach temperature of 12.6° F. (6.8° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

Figure 2A:
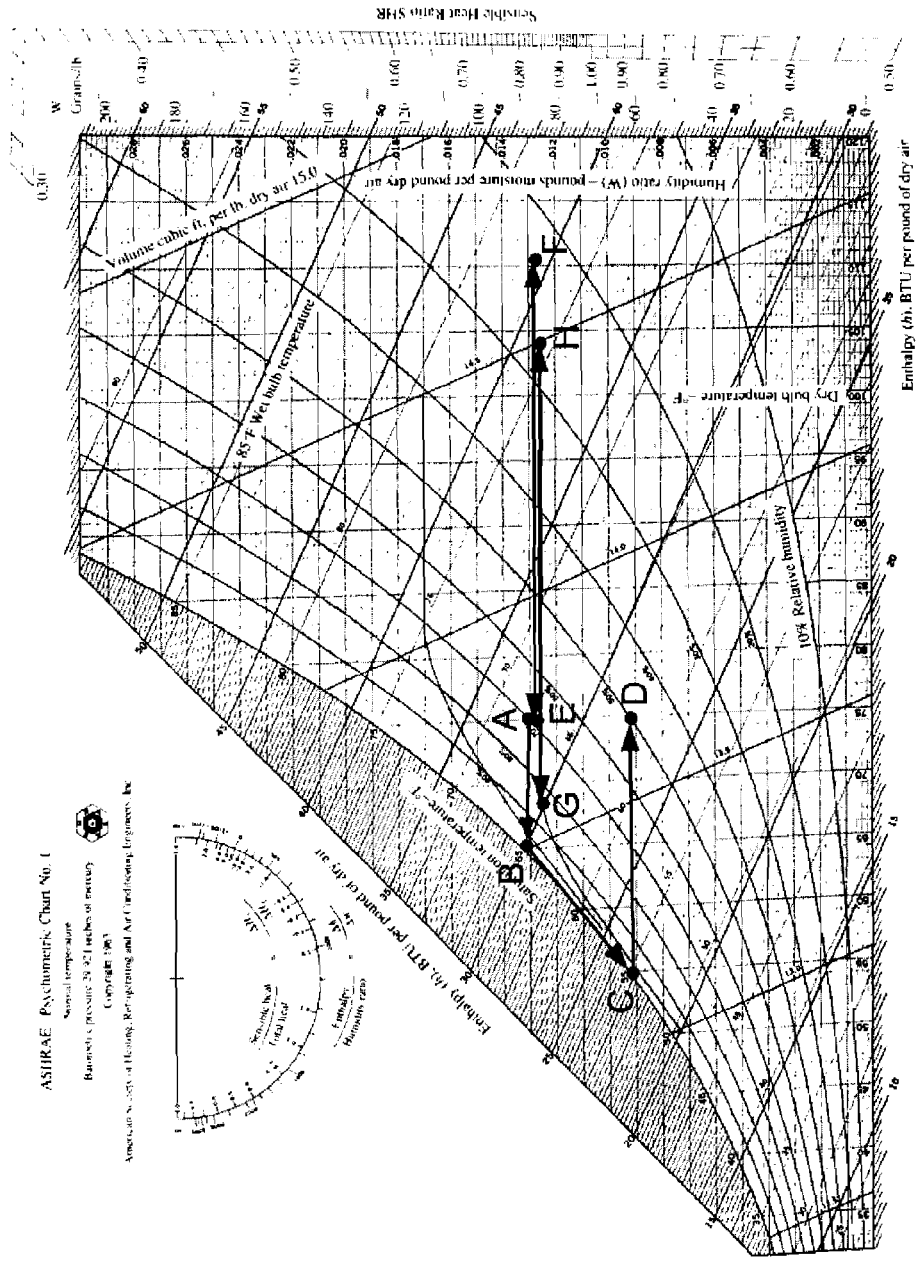
FIG. 2A is a psychometric chart showing a heating and cooling cycle for air in a data center.

FIG. 2A is a psychrometric chart showing a heating and cooling cycle for air in a data center. A psychrometric chart graphically represents the thermodynamic properties of moist air (which is air containing any appreciable moisture, and not merely air that would feel moist to a person). The chart is from ASHRAE Psychrometric Chart No. 1, which defines properties of air for sea level applications. See 1997 ASHRAE Handbook—Fundamentals, at page 6.15. Other charts may also be used, and the chart shown here is merely used to exemplify certain aspects of the concepts discussed in the present document.

The psychrometric chart is crisscrossed with a number of lines that represent various properties of air. Cooling and heating processes on air can be analyzed by identifying a point on the chart that represents air at a particular condition (e.g., temperature and humidity), and then locating another point that represents the air at another condition. A line between those points, generally drawn as a straight line, may be fairly assumed to represent the conditions of the air as it moves from the first condition to the second, such as by a cooling process.

Several properties will be discussed here. First, saturation temperature is an arc along the left of the graph and represents the temperature at which air becomes saturated and moisture begins coming out of the air as a liquid—also known popularly as the "dew point." When the temperature of air is taken below the dew point, more and more water comes out of the air because the cooler air is capable of holding less water.

The dry bulb temperature of air is listed along the bottom of the graph and represents what is popularly viewed as temperature, i.e., the temperature returned by a typical mercury thermometer.

The chart shows two numbers relating to the humidity of air. The first is the humidity ratio, listed along the right edge of the graph, and is simply the weight of moisture per each unit weight of dry air. Thus, the humidity ratio will stay constant at various temperatures of air, until moisture is removed from the air, such as by pushing the air temperature down to its dew point (e.g., the moisture comes out of the air and ends up on the grass in the morning) or by putting moisture into the air (e.g., by atomizing water into such as fine mist in a humidifier that the mist can be supported by the natural motion of the air molecules). Thus, when graphing processes that involve simple changes in air temperature, the point that represents the state of the air will move straight left and right along the graph at a constant humidity ratio. That is because the dry-bulb temperature will go up and down, but the humidity ratio will stay constant.

The second humidity parameter is the so-called relative humidity. Unlike the humidity ratio, which measures the absolute amount of moisture in the air, the relative humidity measures the amount of moisture in the air as a percent of the total moisture the air could possibly hold at its current temperature. Warmer air can hold more moisture than can colder air, because the molecules in warmer air are moving more rapidly. Thus, for an equal amount of moisture in the air (i.e., an equal humidity ratio), the relative humidity will be lower at a high temperature than at a low temperature.

As one example, on a summer day when the overnight low was 55 degrees Fahrenheit and there is dew on the ground, and the daytime high is around 75 degrees Fahrenheit, the relative humidity in the early morning will be about 100% (the dew point), but the relative humidity in the afternoon will be a very comfortable 50%, even if one assumes that the identical amount of water is in the air at both times. This exemplary process is shown in FIG. 2 by the points marked C and D, with point C showing saturated air at 55 degrees Fahrenheit (the overnight low), and point D representing that same air warmed to 75 degrees Fahrenheit (the daytime temperature).

Commercial air handling systems take advantage of this same process in providing conditioned air in a building. Specifically, systems may gather air from an office space at 75 degrees Fahrenheit and a relative humidity of 60 percent. The systems pass the air through a cooling coil that looks like an automobile radiator to cool the air to 55 degrees Fahrenheit, which will typically push the air down to its dew point. This will make moisture pour out of the air as it passes through the cooling coil. The moisture can be captured in drains below the cooling coil and then be removed from the building. The air can then be returned to the work space, and when it warms back to 75 degrees, it will be a very comfortable 50 percent relative humidity.

This common cooling process is shown by points A, B, C, and D on the chart of FIG. 2. Point A shows the 75 degree air at 70 percent relative humidity. Point B shows the air cooled to its dew point, which it hits at a temperature (dry bulb) of about 65 degree Fahrenheit. Further cooling of the air to 55 degrees Fahrenheit (to point C) rides along the saturation curve, and water will come out of the air during that portion of the cooling. Finally, the state of the air moves to point D as the air is warmed and reaches 75 degrees Fahrenheit again. At this point, the relative humidity will be 50 percent (assuming it does not pick up additional moisture from the room or the existing room air) rather than the original 60 percent because the cooling process has dehumidified the air by pulling moisture out of the air in the cooling coil. If the room air contains more moisture than does the cooled air, point D will be slightly above its position shown in FIG. 2, but still below point A.

Such a common process brings with it a number of challenges. First, to cool the air to 55 degrees Fahrenheit, the system must provide cooling water in the cooling coil that can absorb all the heat. Such water would need to be at least cooler than 55 degrees Fahrenheit. It may be expensive to create such cool water—requiring systems such as chillers and other energy-intensive systems. In addition, the area immediately around the pipes that supply the cooling water will be cooler than 55 degrees Fahrenheit, i.e., cooler than the dew point of the air if the pipes run through the workspace or through air having the same state as the air in the workspace. As a result, moisture from the air may condense on the pipe because the temperature of the surrounding air has fallen to its dew point. Thus, insulation may be required around the cool pipes to prevent such condensation, and condensation might occur in any event, and cause rusting, mold, water pooling, or other problems. Finally, as any high school physics student likely knows, it takes a lot of energy to dehumidify, i.e., to change the water from one state to another.

The warm air cooling features discussed with respect to FIG. 1 above may, in certain implementations, avoid one or more of these challenges. An exemplary warm air cooling process is shown on the graph of FIG. 2 by points E and F. Point E shows a room-air condition in a workspace that is near the top of, but within, common guidelines for comfort levels for people dressed in summer clothing. See 1997 ASHRAE Handbook—Fundamentals, at page 8.12. That condition is 75° F. (24° C.), and a relative humidity of about 70 percent (the same as Point A in the prior example). Point F shows heating of that air without the addition of moisture, such as by passing the air over heat-generating computer components in a rack-mounted server system. The temperature rise is 36° F. (20° C.) to bring the air to a state of 111° F. (44° C.) at about 23 percent relative humidity. The air may then be cooled to its original temperature (point E) of 75 degrees Fahrenheit in a cooling coil before it is re-introduced to the work space, without adding water to or removing water from the air.

Points G and H on the graph represent the condition of air in the space immediately surrounding cooling pipes. It is assumed for this example that the cooling supply water is 68 degrees Fahrenheit (20 degrees Celsius) and the return temperature is 104 degrees Fahrenheit (40 degrees Celsius). It is also assumed that the air near the pipes will contain the same moisture level as the rest of the air in the space, and that the air immediately surrounding the pipe takes on the same temperature as the water inside the pipe. As can be seen, this air associate with the cooling water also stays above the saturation point, so that there should be no condensation on the cooling water pipes, and thus no need for insulation to prevent condensation on the pipes.

It can be seen by this process that the air never becomes saturated. As a result, the system need not provide energy to create a phase change in the air. In addition, the system need not provide liquid recovery structures at the cooling coil, or pipe insulation for anywhere. Other similar temperatures, and in many implementations warmer temperatures, may be used. The particular temperatures discussed here are meant to be exemplary only.

Figure 2B:
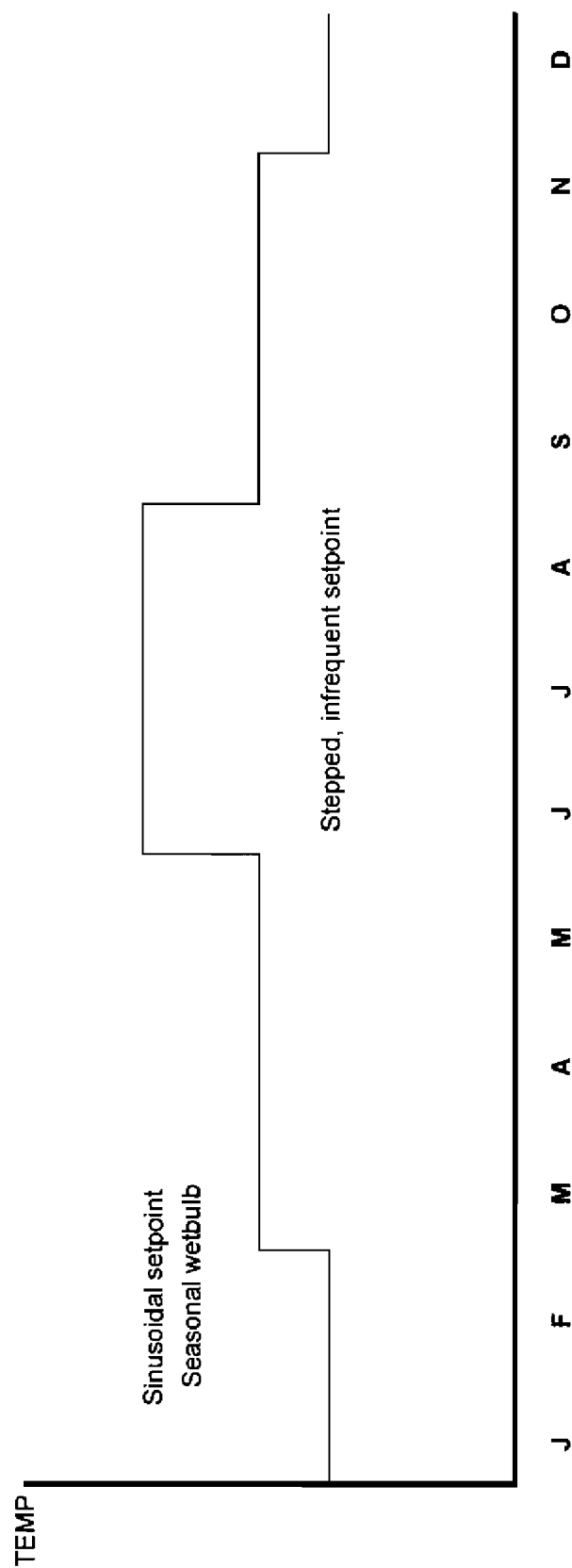
FIG. 2B is a graph of setpoint temperature for a computing facility over a one year time period.

FIG. 2B is a graph of setpoint temperature for a computing facility over a one year time period. The setpoint temperature may be a temperature in a work space such as work space 106 in FIG. 1. An example outdoor wetbulb temperature through the year is also shown for comprison. As shown in the stepped graph, the setpoint temperature (i.e., a targeted temperature) is adjusted infrequently, such as with the seasons or monthly, so as to more closely track expected outdoor temperatures. The setpoint is increased in the summer because the lower winter setpoint may be effectively unattainable in warm summer weather by using only evaporative cooling. Thus, while a "best," lower, setpoint temperature applies in the winter, that same setpoint is not realistic, in the example, in summer months.

The setpoint is adjusted infrequently so as to better approximate a setpoint that is attainable using evaporative cooling techniques with little or no assistance from chillers or other similar components that require relatively high levels of energy to operate. Although increasing the setpoint during warmer times of the year may increase the typical operating temperature, it also decreases the amount of thermal cycling that may occur in a facility, and thus lengthen the life of electronic components in the facility. In contrast, if the setpoint is kept as low as possible, the conditioned space would be relative cool on days having a low wet bulb temperature and relatively warm on days having a high wet bulb temperature. Thus, keeping a constant setpoint throughout the year may actually increase thermal cycling, particularly in warmer months—as the system is able to maintain the setpoint on some days but not on other days.

The setpoint may also be adjusted substantially continuously, such as by varying the setpoint temperature in an annual sinusoidal manner that generally follows the expected outdoor wet bulb temperature, as shown by the sinusoidal setpoint line. Studies have indicated that human discomfort is minimized by providing many minute changes, or continuous changes, to temperature, as opposed to large step variations in temperature. In both examples the setpoint may be maintained, in certain implementations, even if a lower temperature may readily be achieved (e.g., because the outdoor wet bulb temperature is lower than expected) so as to minimize thermal cycling in a facility being cooled.

The particular setpoint temperatures may be selected based on the capabilities of the components in a facility and on prevailing local weather conditions. For example, cool weather setpoints may be in the range of 59-77° F. (15-25° C.), with particular values of 64.4, 68, 71.6, and 75.2° F. (18, 20, 22, and 24° C.). Warm weather setpoints may be in the range of 68-86° F. (20-30° C.), with particular values of 71.6, 75.2, 78.8, and 82.4° F. (22, 24, 26, ad 28° C.). In a particular implementation, warm weather air temperatures in a facility may be approximately 80.60-82.40° F. (27-28° C.) and cold weather temperature may be about 71.60° F. (22° C.). The time for resetting the setpoint may also vary, and may be weekly (e.g., using a long range weather forecast to select an achievable setpoint that tracks the predicted wet bulb temperature), weekly, monthly, or quarterly, for example.

When the wet bulb temperature gets too high to achieve the desired set point, the temperature of the cooling water may be allowed to drift upward with the wet bulb temperature, causing the temperature in space 106 to move upward also. Alternatively, cooling such as from chiller 130 may be provided, and the chilled water may be blended with other cooling water so that the setpoint may be maintained.

Cooling with relatively warm water may also provide certain benefits when chillers are used. In particular, when a chiller is allowed to provide a smaller temperature change to a coolant, it may provide cooling for less electrical consumption per ton of cooling than if it were required to impart a greater temperature change to the coolant. By having elevated air temperatures in a cooled space, the supply water temperature may likewise be higher, and the need for a chiller to cool the water may be less.

Figure 3:
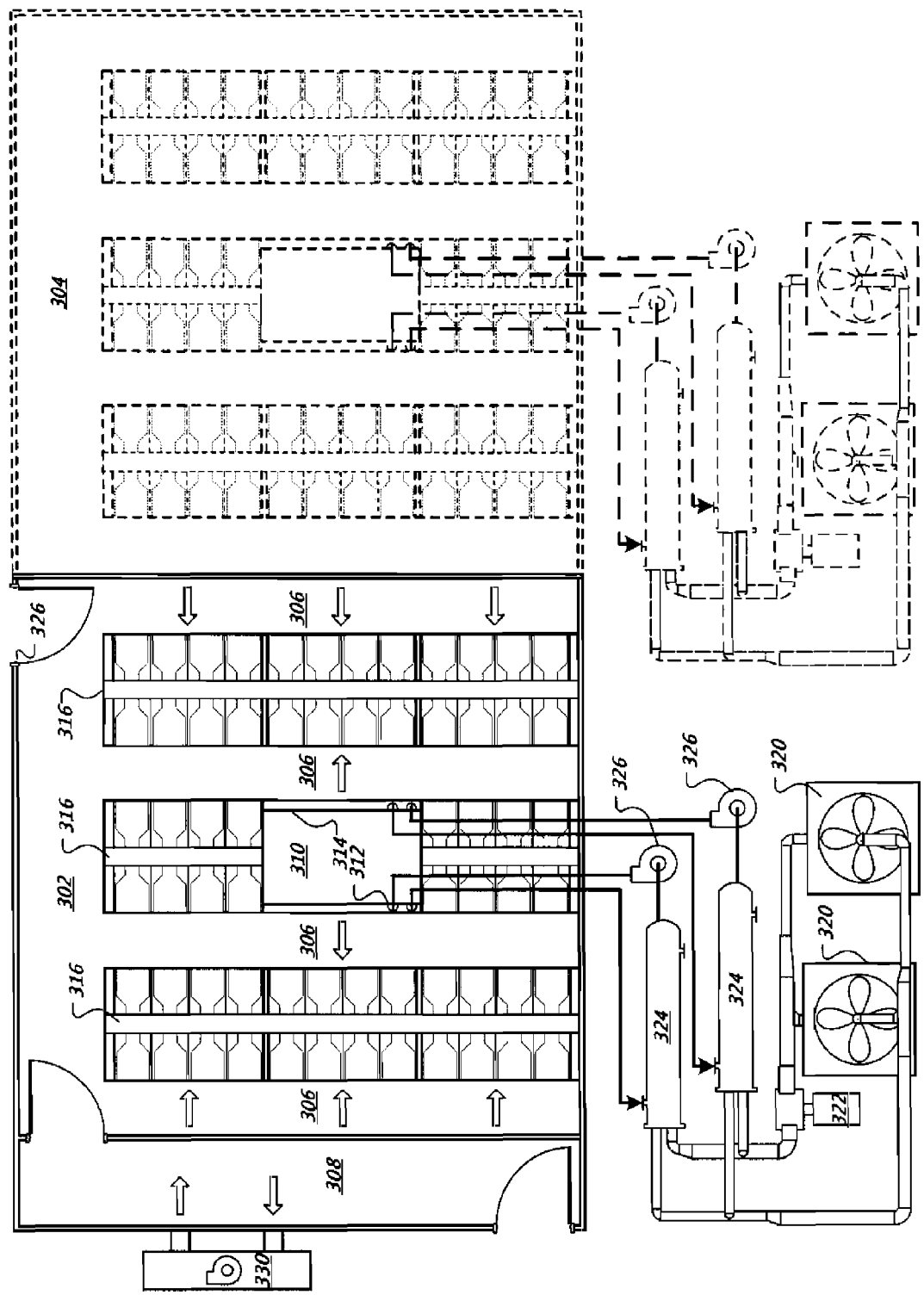
FIG. 3 is a plan view in schematic form of a hydronic cooling system for a data center.

FIG. 3 is a plan view in schematic form of a hydronic cooling system for a data center 300. The data center 300 includes an existing plant 302, and a future plant 304. As will be seen, the system is highly modular, and can therefore be scaled from a very small system to a very large system by adding additional components and subsystems. Although the existing and future systems are shown as separate systems, extensions of the existing system may also be employed for future expansion. For example, oversized piping may be installed in some implementations and may be tapped for future additions of added components when the data center 300 is expanded. Also, other forms of cooling loops, or additional or alternative cooling loops may be employed.

The cooling system for existing plant 302 is similar to that shown in FIG. 1. Cold air is supplied to a workspace 306 by air handling unit 310. Air handling unit 310 may include a supply fan (not shown) that draws warm air out of a plenum, such as in an above-ceiling attic space, and pushes the air through cooling coils 312, 314. The warm air may be produced by passing cooled air over computers, such computers mounted on trays in a rack system. Air passing over the computers may be collected in warm-air plenums 316, and may be routed to the above-ceiling space or another appropriate space.

In alternative implementations, multiple air handling units that include a fan and a cooling coil may be placed immediately above or below the warm air plenums 316. Such air handling units may take the form of long banks of small centrifugal fans and long heat exchange units mounted to the fans. The fans may pull air or push air through the coils. Pushing air may have the advantage of being quieter, as the coils may block out a certain amount of the fan noise. Also pushing of air may be more efficient. Pulling of air may provide a benefit of allowing a limited number of fans to operate on a much larger bank of coils, as all the pulling fans can be connected to a plenum, and may create a relative vacuum behind the coils to pull air through. In such an arrangement, if one of the fans breaks down, the others can more easily provide support across the entire coil length.

Cooling water may be provided by pumps 326 to cooling coils 312, 314 to cool the air. These pumps 326 may draw cooled water from heat exchangers 324, and drive the water into existing plant 302, through cooling coils 312, 314, and back through heat exchangers 324, where the heat acquired from coils 312, 314, may be removed from the water.

Heat in the cooling water may be removed from heat exchangers 324 by cooled tower water supplied through pump 322 from cooling towers 320. The system is shown for exemplary purposes as having two parallel circuits for cooling water and one circuit for tower water from the cooling towers 320. However other appropriate arrangements for the piping system may also be used. For example, a single heat exchanger may be used, as may a single cooling tower. Other sources of free cooling may also be used, such as ground water or deep lake cooling.

Also, additional space may be provided for extra cooling towers and future heat exchangers, and piping may be sized to accommodate future expansion. For example, cooling towers may be provided in an extendable stacked arrangement, so that a third tower will be piped in parallel with the first two towers 320 when the additional cooling is needed.

Existing plant 302 includes an additional workspace 308. This space may be for example, an office space, control room, or storage room. The space may be designed to be inhabited extensively by people, and may require lower temperatures than does workspace 306. As a result, workspace 308 is provided with air-conditioning unit 330, which may be a standard rooftop air conditioning unit. Although air-conditioning unit 330 may require additional electricity for providing higher degrees of cooling, including latent heat removal, the unit 330 generally serves an area and a thermal load that is much smaller than the entire system. As a result, unit 330 may be much smaller than what would otherwise be required to provide similar low-temperature cooling for the rest of the system.

Although not shown, one or more chillers and chillers circuits may be provided to operate the system, in addition to the tower cooling water circuit, whether together or alternatively. The piping of the chiller circuit may take a form similar to that shown schematically in FIG. 1.

As noted above, future plant 304 may be provided in a variety of ways. In general, a modular approach may be used, so that additional heat exchangers are added in a size commensurate with the additional loads that are expected. Certain components may be piped as entirely separate circuits, while others may be extensions of the original system. Sharing components between old and new systems may cause construction-based interruptions in the existing system, but may also provide for better utilization of the components in the full system. For example, condenser water can be shared through the system, so that if each half of the system requires cooling from 1.5 cooling towers, only three towers will be operated. If the two systems are separate, each system would have to run two towers, and thereby use additional energy.

Figure 4:
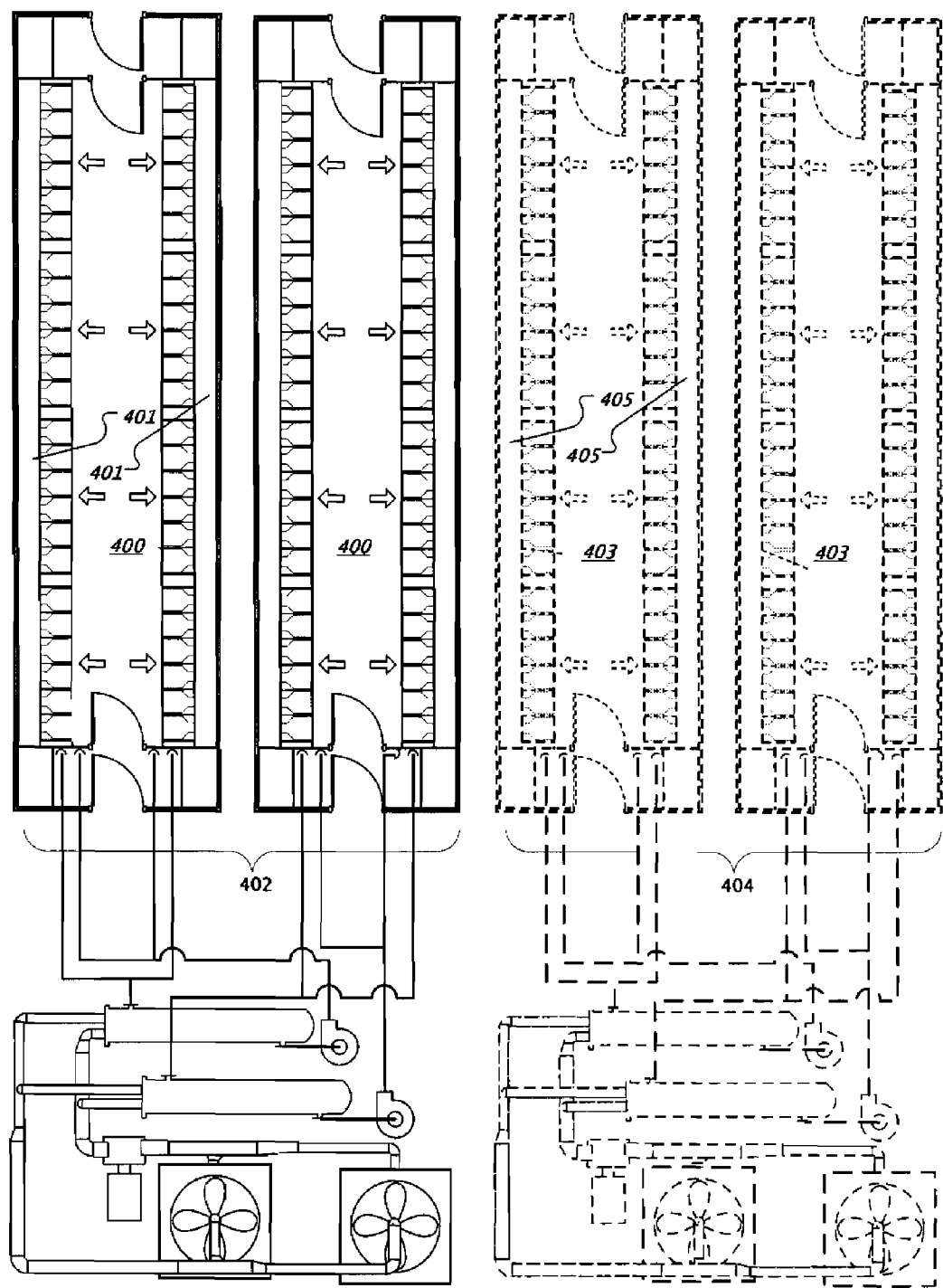
FIG. 4 is a plan view in schematic form of a hydronic cooling system for a data center housed in shipping containers.

FIG. 4 is a plan view in schematic form of a hydronic cooling system for a data center housed in outdoor shipping containers 402 and 404. The system is arranged in a manner similar to the system in FIG. 3. Here, however, cooling coils are mounted along the length of both of shipping containers 402, 404, such as below or above the computer-holding racks in the system. For example, an elevated false floor may be provided down the center of the shipping containers 402, 404, and squirrel cage or other forms of fans may blow warm air through cooling coils, depositing cool air into the space under the grate. The cooled air may then pass up through the floor grate into cooled-air isles 400, 403, and then drawn by fans associated with each tray in the racks, into warm-air plenums 401, 405 along the sides of the shipping containers, and may be routed back through the fans. Using exterior space along the outer walls for the warm-air plenums 401, 405 may have the advantage of allowing direct rejection of heat on cold days and of minimizing the amount of atmospheric heat that passes into each container on hot days.

In this implementation, the various benefits of using little energy, of modularity, and of standardization on low complexity components may be appreciated. Specifically, shipping containers 402, 404 may be built and outfitted in a central location using standardized techniques and specialized, well-trained labor—a type of prefab construction approach. The shipping containers 402, 404 may then be delivered to a site, such as a site having adequate electrical, water, and data services, and may be easily connected to such services, and then begin their operation.

The other components of the system may be provided separately to the site. For example heat exchangers and pumps may be provided on preassembled skids, dropped into the place, and connected to other components. Cooling towers may also be delivered to a site and connected relatively quickly. Also, because the system may operate without the need for components such as chillers that demand high power levels, the system may be installed in more areas, such as remote areas having lower levels of electrical service.

As shown, the system is also highly modular, so that additional resources may be added relatively quickly and inexpensively as they are needed. Containers 402 are shown as part of an existing system, and containers 404 (with associated equipment) are shown as part of a future addition to the system. Other modules may also be added as the need arises, until the level of available utilities is tapped out. Each container may contain hundreds or thousands of trays, so that a complete installation could include hundreds of thousands of computers.

Systems like those shown in this document may be deployed in a number of different and flexible manners. For example, locations may be selected according to the availability of resources. For example, cooling water may be obtained from ground water or surface water for free cooling processes. In such an environment, cooling towers may be eliminated from the system.

In addition, systems may be deployed far from suitable construction labor (and may use labor having a lower skill level) if they are assembled centrally and shipped to a site.

Such systems may also be self-contained. For example, fuel cells or gas-powered turbines may be deployed with a system to generate electricity, and may be supplemented by wind or solar power. In addition, generators, such as combustion turbines may be selected for less than the full load of a system, but may be deployed to permit peak-shaving of the power required by a system. Such peak-shaving may permit a system to operate in an area that cannot provide all of the power needed for a system. In addition, peak shaving may allow an operator of the system to negotiate energy rates that are lower than would otherwise be available, because the system would not be drawing high levels off the grid when the electrical provider does not have such extra capacity. Moreover, heat from the turbines may be used to help power equipment such as an ammonia-based absorption chiller. In addition, Peltier-like devices may be used to convert heat into electrical energy. In addition, excess pressure from make-up water applied to the cooling towers may also be used to drive small turbines for limited electrical production.

Such systems may also be co-located with other systems that may have use for the hot water generated through the cooling of electronic components. For example, a data center may be located near a hospital or other high density residence to supply heating water, such as for space heating or water heating. In addition, the hot water may be used in common with various processes, such as fermentation, manure digestion, yoghurt culture fabrication, and ethanol production.

Moreover, the hot water may be used to heat swimming pools or other buildings, or may be run through ice and snow melt piping, such as in airport runways. Likewise, heat from the system may be used to control temperatures in a co-located fish farm. Other implementations may also be employed to serve particular needs for data services, particularly where distribution of processing power closer to end users is needed.

Figure 5:
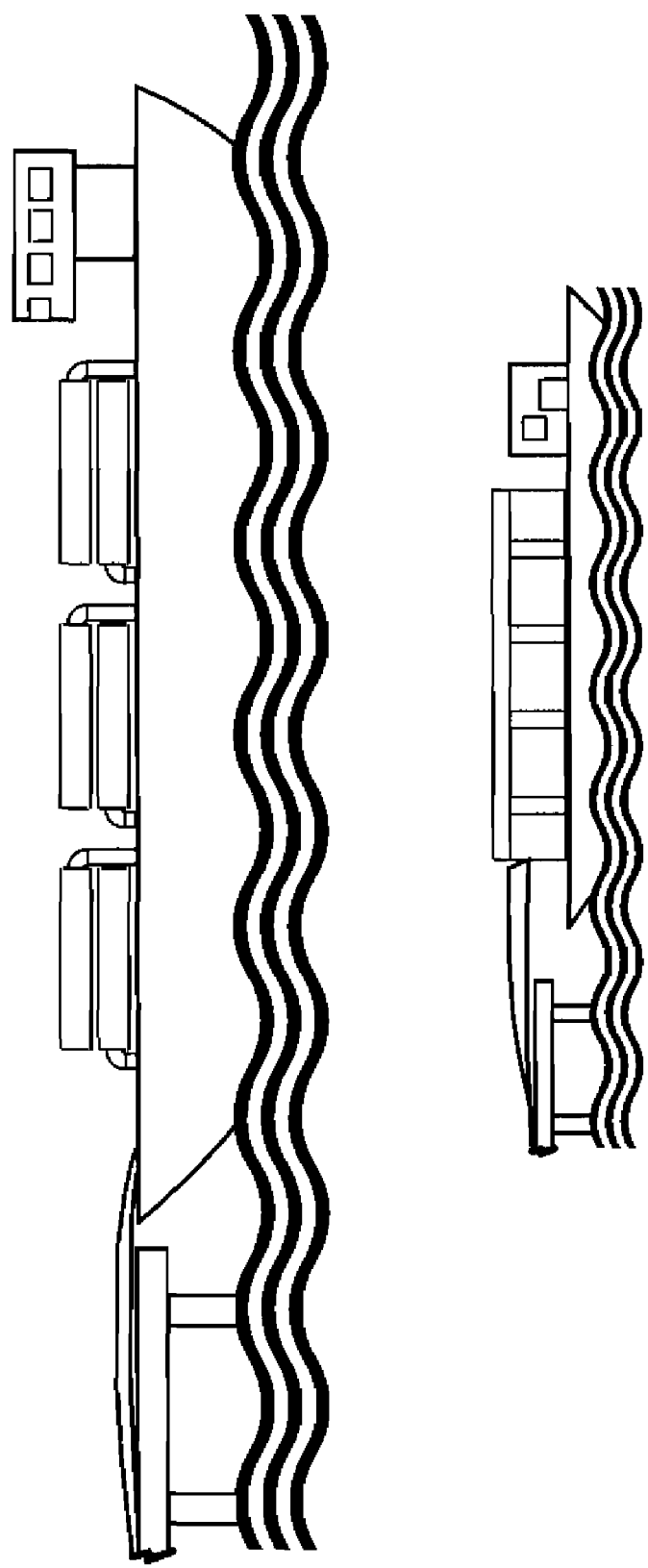
FIG. 5 shows container-based data centers mounted on a docked container ship and barge.

FIG. 5 shows container-based data centers mounted on a docked container ship and a barge. These are simplified diagrams showing one particular implementation of a container-based data center. Specifically, data centers may be constructed modularly in shipping containers at a central location, and then may be transported to loading docks in a conventional manner. In some implementations, the shipping containers may be moved off the boats, and may be deployed onto land. The cooling systems and other systems to support the data centers may be shipped with the systems, or may be prepared on land while the containers are being prepared and shipped.

In addition, such portable systems (i.e., capable of being loaded onto a truck or train, and transported to another location for use) are also capable of being redeployed to another fixed location relatively easily. For example, if a particular location faces unexpected data loads, and another location has lower-than-expected loads, containers may be moved from the second location to the first.

As shown in FIG. 5, however, the systems are being used on the boats. Specifically, the boats are docked, with utility lines running to the docks. The utility lines may include electrical, data, and cooling water lines, such as lines for make-up water if cooling towers are located on the boats. Cooling towers or other cooling mechanisms may also be located near the dock, as may heat exchangers, and condenser or cooling water may be piped to the boats.

Alternatively, cooling water may be obtained out of the body of water in which the boats sit, such as when free cooling using deep lake cooling. In addition, generators on the boat or other sorts of power plants on the boats, may generate electricity for the data centers. In such situations, a boat may be anchored offshore, and may attach to an offshore data connection, such as an optical fiber connection. In this manner, computing power may be easily projected geographically on short notice, and may be alternatively used at sea and on land as the need arises. For example, where a large event is expected to occur, or a large number of computer users is expected to congregate, near a port, such a data center may be supplied at the port.

The containers may be networked for electricity, data, and cooling, in an appropriate manner. In addition, access ladders or other structures may be provided where the containers are stacked on top of each other.

Figure 6:
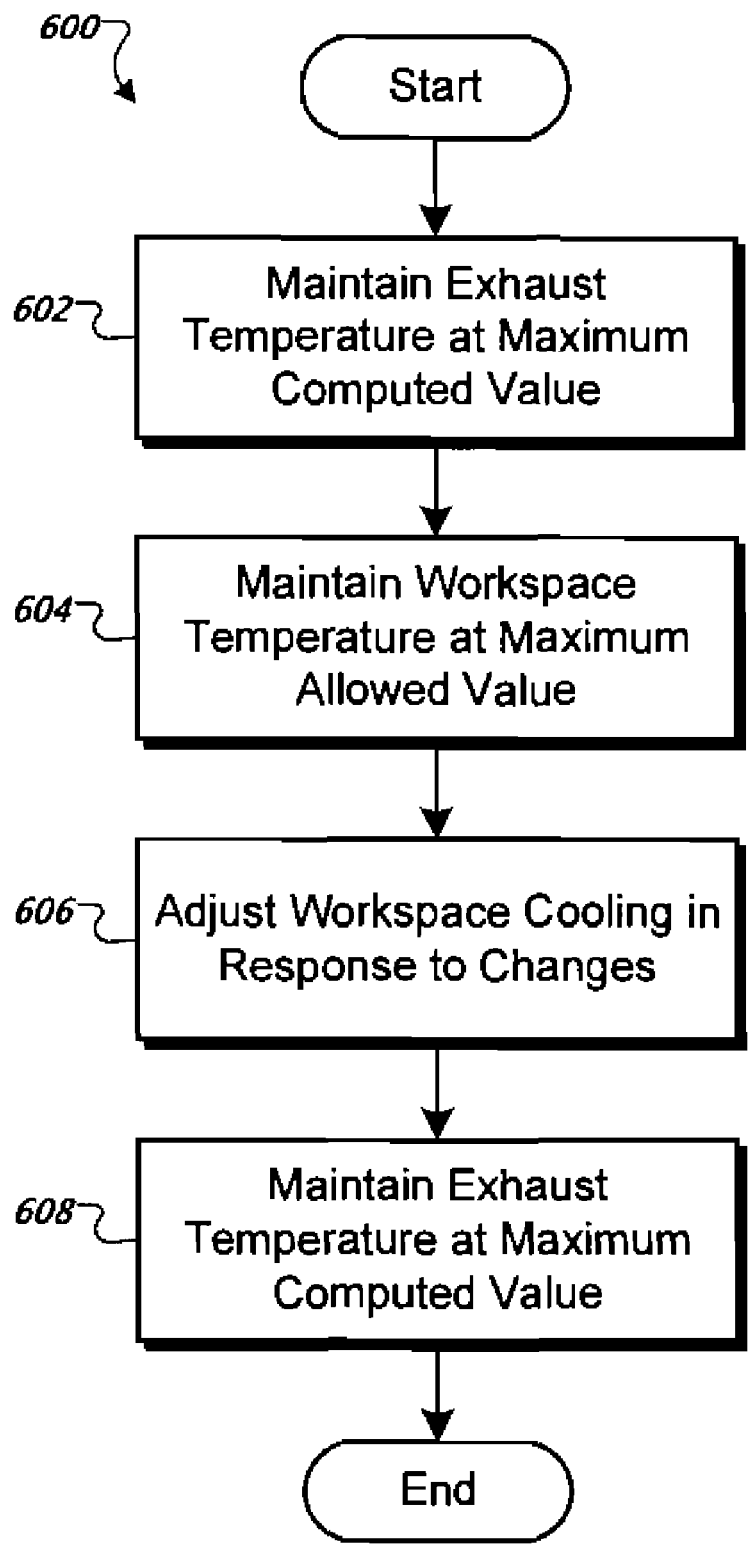
FIG. 6 is a flowchart showing steps for cooling a data center using elevated temperatures.

FIG. 6 is a flowchart 600 showing steps for cooling a data center using elevated temperatures. The method is exemplary only; other steps may be added, steps may be removed, and the steps may be performed in different orders than those shown, as appropriate.

At box 602, the exhaust temperatures of various trays in a computer rack system are maintained at a computed value, such as a maximum value for maintaining the trays in reliable operation. The trays may each be self-throttling, in that a fan and related temperature sensor may be associated with each tray. At the same time, other components of the system may maintain a workspace temperature in front of the racks at a particular temperature, such as a maximum allowed temperature. The maximum allowed temperature may be, for example, a maximum temperature at which the workers in the workspace are willing to operate. It may also be a temperature set by law or regulation, such as a maximum 40 degree Celsius limit. Federal OSHA and California OSHA guidelines may provide limitations on such temperatures. The set temperature may also change at appropriate times; for example, the temperature may be higher during times when people are not expected to be in the workspace.

At box 606, the workspace cooling is changed in response to changes in the system. Such changes may occur, for example, if the set temperature for the space changes. The changes may also occur, for example, if the temperature remains constant but the load on the system changes—such as if an additional rack of computers is powered up, or if the computers are loaded more heavily. The cooling may change, for example, by increasing the rate of pumping cooling fluid through cooling coils. Alternatively, additional coils may be brought on-line, or a chiller may be started to lower the temperature of cooling water.

At box 608, the exhaust temperature of air from the computer racks is maintained at the maximum computer value. Specifically, although the workspace temperature has changed, and other parameters in the system may have changed, the exhaust temperature may remain unaffected, as each fan associated with a tray remains set on one exhaust temperature.

A number of embodiments have been described. Nevertheless, it will be understood that various modifications may be made without departing from the spirit and scope of what is described. For example, the steps of the exemplary flow chart on FIG. 6 may be performed in other orders, some steps may be removed, and other steps may be added. Accordingly, other embodiments are within the scope of the following claims.

What is claimed is:

1. A method of providing cooled air to electronic equipment, comprising:

capturing air from a human-occupiable workspace in a data center and controlling flow of the air through a volume containing electronic equipment so that the air rises in temperature by twenty degrees Celsius or more from an ambient temperature of the workspace as it passes through the volume, and capturing the heated air from the volume;

cooling the heated air by twenty degrees Celsius or more in an air-to-water heat exchanger;

supplying cooling water to the air-to-water heat exchanger at a temperature above a dew point temperature of the heated air; and controlling the water to maintain the temperature of the cooling water at the temperature above the dew point temperature of the heated air, wherein the captured air passes by parallel paths through a plurality of vertically-stacked bays defined in the volume such that the air rises in temperature by twenty degrees Celsius or more from the ambient temperature of the workspace while passing between a first side and a second side of particular ones of the plurality of bays, the first side being open to the workspace to allow access to computing devices mounted in the particular ones of the plurality of bays while the captured air passes through the plurality of bays, and at least a portion of the airflow circulates through a circulation loop that comprises an airflow path from the workspace to a respective bay of the plurality of vertically-stacked bays in the volume, then to an area of a warm air plenum positioned in the volume behind the respective bay, then from the area of the warm air plenum positioned in the volume behind the respective bay to an area of the warm air plenum in an attic space above the volume, then from the area of the warm air plenum in the attic space above the volume to the air-to-water heat exchanger positioned in the volume.

2. The method of claim 1, wherein the step of capturing the heated air comprises capturing substantially only the heated air, and capturing substantially no air that is not from the volume containing the electronic equipment.

3. The method of claim 1, wherein the cooling water is returned from the air-to-water heat exchanger at a temperature above 40 degrees Celsius.

4. The method of claim 1, further comprising returning water from the air-to-water heat exchanger, wherein the temperature of the supplied water is more than 15 degrees Celsius cooler than the temperature of the returned water.

5. The method of claim 1, further comprising returning water from the air-to-water-heat exchanger and transferring heat from the returned water to water supplied from an evaporative cooling water source.

6. The method of claim 5, wherein the evaporative cooling water source comprises one or more cooling towers.

7. The method of claim 5, wherein the temperature of the returned water is more than 10 degrees Celsius warmer than the water supplied from the evaporative cooling water source.

8. The method of claim 1, wherein an approach temperature of the cooled air and the cooling water is less than about 5 degrees Celsius.

9. The method of claim 1, further comprising maintaining a cooling setpoint that is based on an expected wet bulb temperature occurring substantially continuously for one week or more.

10. The method of claim 1, wherein a cooling setpoint changes substantially continuously over a time duration.

11. A method of providing cooled air to electronic equipment, comprising:
    heating air drawn from a human-occupiable workspace by a temperature differential of 20 degrees Celsius or more by passing it over electronic equipment along the height of an equipment rack that houses the electronic equipment,
    cooling, by one or more cooling coils, the heated air from the electronic equipment by approximately the same temperature as the temperature differential by supplying cooling water to the one or more cooling coils at a temperature above a dew point temperature of the heated air; and
    returning the cooled air to the workspace,
    wherein the air passes by parallel paths through a plurality of bays defined in the equipment rack such that the air rises in temperature by twenty degrees Celsius or more from the ambient temperature of the workspace while passing between a first side and a second side of particular ones of the plurality of bays, the first side being open to the workspace to allow access to the electronic equipment mounted in the particular ones of the plurality of bays while the air passes through the plurality of bays, and
    at least a portion of the airflow circulates through a circulation loop that comprises an airflow path from the workspace to a respective bay of the plurality of bays in a volume comprising the workspace, then to an area of a warm air plenum positioned in the volume behind the respective bay, then from the area of the warm air plenum positioned in the volume behind the respective bay to an area of the warm air plenum in an attic space above the volume, then from the area of the warm air plenum in the attic space above the volume to the one or more cooling coils positioned in the volume.

12. The method of claim 11, further comprising receiving, in the one or more cooling coils, a flow of cooling fluid cooled using evaporative cooling with no refrigeration.

13. The method of claim 12, wherein heating the air from the workspace comprises heating the air from about 25 degrees Celsius to more than 45 degrees Celsius.

14. The method of claim 13, wherein a temperature of the heated air is at or near a maximum failure preventative temperature for the electronic equipment.

15. The method of claim 11, wherein the cooled air is returned directly to the workspace after it is cooled by the one or more cooling coils.

16. The method of claim 11, wherein the electronic equipment comprises a large plurality of rack servers in a data center.

17. The method of claim 11, wherein the heated air is drawn through the plurality of bays and circulated by a fan located above the equipment rack into the portion of the warm air plenum that extends above, and is thermally separated from, the human-occupiable workspace, and wherein the air is further circulated from the warm air plenum through the one or more cooling coils and back to the human-occupiable workspace.

18. The method of claim 1, further comprising maintaining a setpoint that maintains air around the electronic equipment at a temperature below an expected failure level for the electronic equipment.

19. The method of claim 18, wherein the setpoint maintains a temperature in a human-occupied space around the electronic equipment above 75 deg. Fahrenheit.

20. The method of claim 1, further comprising capturing the heated air in one or more common warm air plenums and cooling the heated air with the air-to-water heat exchanger before circulating the cooled air into an occupied workspace around the electronic equipment.

21. The method of claim 20, further comprising drawing air directly from the workspace into open-front racks that hold the electronic equipment.

22. The method of claim 20, further comprising routing the captured heated air from the one or more common warm air plenums into an attic space, and delivering the captured air to the workspace using an air handler and a conduit adjacent to the workspace.

23. The method of claim 1, further comprising controlling flow rates of air through racks using fans located between the volume containing the electronic equipment and one or more common warm air plenums.

24. The method of claim 1, further comprising cooling the water using an evaporative cooling system having a plurality of cooling towers and no operating chiller.

25. The method of claim 24, wherein the cooling towers comprise hybrid cooling towers.

26. The method of claim 1, wherein the heated air enters the air-to-water heat exchanger at a temperature over 110 deg. Fahrenheit.

27. The method of claim 1, wherein the heated air is drawn from the volume and circulated by a fan located above the volume into the portion of the warm air plenum that extends above, and is thermally separated from, the human-occupiable workspace in the data center, and wherein the air is further circulated from the warm air plenum through the air-to-water heat exchanger and back to the human-occupiable workspace.

* * * * *

UNITED STATES PATENT AND TRADEMARK OFFICE
CERTIFICATE OF CORRECTION

| | | |
|---|---|---|
| PATENT NO. | : 8,209,993 B2 | Page 1 of 1 |
| APPLICATION NO. | : 11/757345 | |
| DATED | : July 3, 2012 | |
| INVENTOR(S) | : Andrew B. Carlson et al. | |

It is certified that error appears in the above-identified patent and that said Letters Patent is hereby corrected as shown below:

Column 19, line 10, in Claim 5, delete "air-to-water-heat" and insert -- air-to-water heat --

Signed and Sealed this
Eleventh Day of September, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,209,993 B2 | Page 1 of 1 |
| APPLICATION NO. | : 11/757345 | |
| DATED | : July 3, 2012 | |
| INVENTOR(S) | : Carlson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 138 days.

Signed and Sealed this
Twenty-seventh Day of November, 2012

David J. Kappos
*Director of the United States Patent and Trademark Office*